(12) United States Patent
Ledermann et al.

(10) Patent No.: US 12,092,548 B2
(45) Date of Patent: Sep. 17, 2024

(54) METHOD FOR DIAGNOSING EXHAUST GAS SENSORS

(71) Applicant: Robert Bosch GmbH, Stuttgart (DE)

(72) Inventors: Bernhard Ledermann, Weil der Stadt (DE); Danka Dittmer-Gobeljic, Stuttgart (DE); Claudius Bevot, Stuttgart (DE); Fabian Baumann, Affalterbach (DE)

(73) Assignee: ROBERT BOSCH GMBH, Stuttgart (DE)

( * ) Notice: Subject to any disclaimer, the term of this patent is extended or adjusted under 35 U.S.C. 154(b) by 417 days.

(21) Appl. No.: 17/599,032

(22) PCT Filed: Mar. 24, 2020

(86) PCT No.: PCT/EP2020/058055
§ 371 (c)(1),
(2) Date: Sep. 28, 2021

(87) PCT Pub. No.: WO2020/200896
PCT Pub. Date: Oct. 8, 2020

(65) Prior Publication Data
US 2022/0178788 A1    Jun. 9, 2022

(30) Foreign Application Priority Data

Apr. 4, 2019   (DE) .......................... 102019204827.7

(51) Int. Cl.
*G01M 15/10*       (2006.01)
*G01R 31/52*       (2020.01)
(52) U.S. Cl.
CPC ........... *G01M 15/104* (2013.01); *G01R 31/52* (2020.01)

(58) Field of Classification Search
CPC ........... G01M 15/104; G01N 27/4175; G01N 27/4163; G01N 27/4065; G01N 27/409;
(Continued)

(56) References Cited

U.S. PATENT DOCUMENTS

2012/0293183 A1*  11/2012  Ledermann ........ G01N 27/4065
                                                    324/543
2013/0219984 A1    8/2013  Paggel et al.
(Continued)

FOREIGN PATENT DOCUMENTS

CN         102472185 A         5/2012
CN         103291429 A   *     9/2013  ......... F02D 41/1456
(Continued)

OTHER PUBLICATIONS

International Search Report for PCT/EP2020/058055, Issued Jun. 23, 2020.

*Primary Examiner* — Andre J Allen
(74) *Attorney, Agent, or Firm* — NORTON ROSE FULBRIGHT US LLP; Gerard A. Messina

(57) ABSTRACT

An evaluation and control unit, designed as an ASIC, for operating a broadband lambda sensor that includes at least one electrical line. The evaluation and control unit includes at least one electrical terminal for electrically connecting to the electrical line of the broadband lambda sensor, and a device for determining a setpoint value of a current flowing into the electrical terminal and for comparing this setpoint value with the current actually flowing into the electrical terminal and for comparing with the aid of comparators the electrical potential being applied to the electrical terminal with predefined limits.

7 Claims, 3 Drawing Sheets

(58) Field of Classification Search
CPC .... G01N 27/41; G01N 27/419; G01N 33/007;
G01N 27/407; G01N 27/028; G01R
31/52; G01R 31/007; G01R 31/54; G01R
31/00; G01R 31/58; G01R 31/2829;
G01R 27/20; G01R 31/083
See application file for complete search history.

(56) References Cited

U.S. PATENT DOCUMENTS

| | | | |
|---|---|---|---|
| 2013/0234744 A1 | 9/2013 | Carbonaro et al. | |
| 2015/0047411 A1* | 2/2015 | Ledermann | G01N 33/007 73/1.06 |
| 2015/0068278 A1 | 3/2015 | Yazawa et al. | |
| 2016/0201588 A1* | 7/2016 | Bevot | F02D 41/28 73/114.73 |
| 2018/0246157 A1 | 8/2018 | Zarabadi et al. | |
| 2021/0348575 A1* | 11/2021 | Wagner | F01N 11/00 |
| 2022/0065922 A1* | 3/2022 | Kremer | G01M 15/104 |

FOREIGN PATENT DOCUMENTS

| | | | | |
|---|---|---|---|---|
| CN | 104583787 A | | 4/2015 | |
| DE | 19729696 A1 | | 2/1999 | |
| DE | 102010000663 A1 | * | 7/2011 | ......... G01N 27/4065 |
| DE | 102011004073 A1 | * | 8/2012 | ......... G01N 27/4175 |
| DE | 102011089383 A1 | * | 6/2013 | ......... F02D 41/1456 |
| DE | 102012201467 A1 | | 8/2013 | |
| JP | H05107299 A | | 4/1993 | |
| JP | H06273281 A | | 9/1994 | |
| JP | 2002181892 A | | 6/2002 | |
| JP | 2004317488 A | | 11/2004 | |
| JP | 2005300240 A | | 10/2005 | |
| JP | 2005331310 A | | 12/2005 | |
| JP | 2006047278 A | | 2/2006 | |
| JP | 2007315926 A | | 12/2007 | |
| JP | 2010256233 A | | 11/2010 | |
| JP | 2013508699 A | | 3/2013 | |
| JP | 2017502098 A | | 1/2017 | |
| JP | 2017089440 A | | 5/2017 | |
| JP | 2018013057 A | | 1/2018 | |
| WO | WO-2011048002 A1 | * | 4/2011 | ......... F02D 41/1477 |

* cited by examiner

METHOD FOR DIAGNOSING EXHAUST GAS SENSORS

BACKGROUND INFORMATION

Possibilities for diagnosing a lambda sensor are described, for example, in German Patent Application No. DE 19729696 A1 which describes a method for controlling the functions of a lambda sensor, in which it is provided that the internal resistance of the ceramic sensor body is measured, compared with a setpoint value ascertained as a function of the temperature of the gas to be detected and of the heating power of the sensor heater, and an error signal is generated if the measured value exceeds the setpoint value.

SUMMARY

An object of the present invention is to always be able to reliably diagnose the presence of a short circuit or shunt of an electrical line of a broadband lambda sensor. This may be achieved with example embodiments of the present invention.

In accordance with an example embodiment of the present invention, it is provided in particular that short circuits or shunts may be established in that the electrical potential being applied to the terminal is outside of predefined limits. In this case, the limits involved may be defined by potentials, for example, which are no longer to be expected at this time during normal operation of the broadband lambda sensor, i.e., if there is no short-circuit.

The comparison of the electrical potential being applied to the terminal with the predefined limits may preferably take place with the aid of hardware comparators, since the latter work very rapidly, so that damage to the broadband lambda sensor and/or to the evaluation and control unit, for which there would otherwise be a risk in an error case of this type, may be reliably avoided.

Furthermore, an example embodiment of the present invention in particular provides that short circuits or shunts may also be established if the electric current actually flowing into the terminal differs from a setpoint value by more than a threshold value. This case is basically also possible, without the electrical potential being applied to the terminal being outside of the above-mentioned predefined limits, i.e., without a short circuit already being detected according to the situation explained above. With the aid of the method according to the present invention, it is thus possible to detect any short circuits and shunts.

Depending on whether the electric current flowing into the terminal is greater or lower than the setpoint value, it is possible to deduce a short circuit to ground or a short circuit to a positive potential in this case.

It is possible, in particular, that the setpoint value is defined by the current value that is specified for a constant current source of the control and evaluation unit connected to the terminal. The connection between the terminal and the constant current source may for example take place via an electrochemical cell of the broadband lambda sensor that is connected via two electrical lines of the broadband lambda sensor with the terminal and with a further terminal of the control and evaluation unit.

If the wiring of the broadband lambda sensor is more complex than in the above-mentioned case, the setpoint value is ascertained on the basis of other defined advance information and/or on the basis of measurements and/or on the basis of computations.

A setpoint value may involve a current value that is different from zero. However, a value 0 µA may also be admissible.

It is possible, in particular, that the threshold value is defined by an expected measuring accuracy, for example 2 µA or less.

It is possible that the broadband lambda sensor includes several electrical lines and the evaluation and control unit includes several terminals, each line being connected to a terminal. The diagnosis may then be carried out cyclically for all lines, i.e., in particular in a specific sequence one after another in a repeating manner. Further processing of this information may then be used to ascertain a short circuit voltage and a short circuit resistance Rk, and the presence of a short circuit (Rk<1 Ohm) may be line-selectively differentiated from the presence of a shunt (1 MOhm>Rk>1 Ohm).

If the resistance that formally appears to be a short circuit resistance has a resistance value of >1 MOhm, an error-free case is in particular assumed, i.e., there is neither a short circuit nor a shunt at this electrical connection of the broadband lambda sensor; the latter is intact.

DETAILED DESCRIPTION OF EXAMPLE EMBODIMENTS

Figure 1:
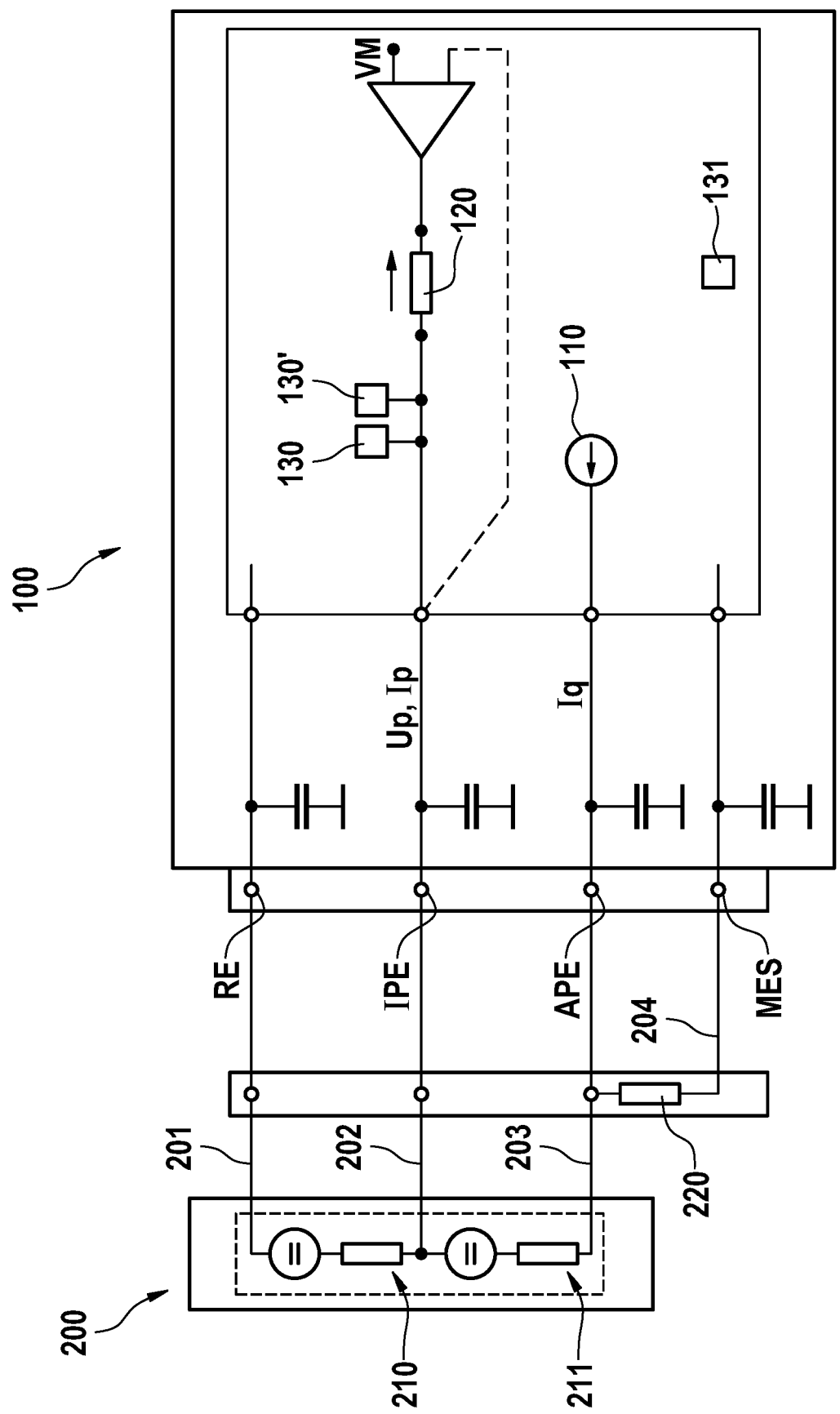
FIG. 1 shows a broadband lambda sensor and an evaluation and control unit connected thereto.

FIG. 1 shows an evaluation and control unit 100 that is connected via its four electrical terminals RE, IPE, APE, MES to four electrical lines 201 through 204 of a broadband lambda sensor 200. In this example, electrical lines 201 through 204 of broadband lambda sensor 200 lead to the electrodes of an electrochemical Nernst cell 210 and an electrochemical pump cell 211 of broadband lambda sensor 200 and to an ohmic resistance 220 of broadband lambda sensor 200.

Details of the broadband lambda sensor may be designed as indicated in German Patent Application No. DE 10 2011 007 068 A1, for example.

In the present example, evaluation and control unit 100 includes a constant current source 110 that is connectable to terminals RE, IPE, APE, MES of evaluation and control unit 100 via corresponding switches (not illustrated) and includes a current measuring device 120 that is also connectable to terminals RE, IPE, APE, MES of evaluation and control unit 100 via other switches (not illustrated).

Figure 2:
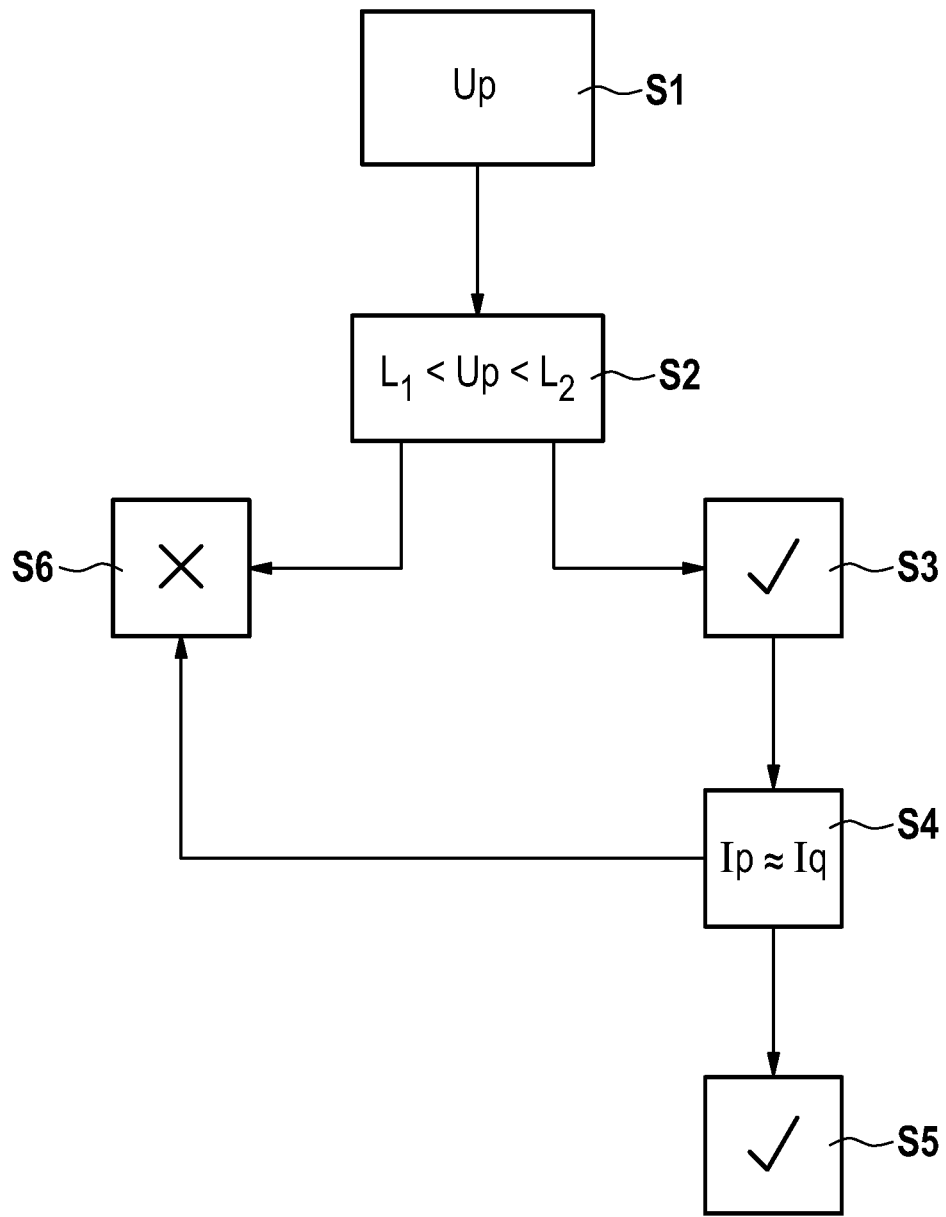
FIG. 2 shows a flowchart of one exemplary embodiment of the method according to the present invention.

In the present example, after the start of the electronic system potential Up is initially measured at terminal IPE of the evaluation and control unit (method step S1, see FIG. 2).

In the present example, it is then established with the aid of hardware comparators 130, 130' that this potential Up is within the predefined limits L1, L2 (method step S2).

After it is ensured by passively and/or actively heating the broadband lambda sensor that the electrochemical cells have a sufficiently low resistance, constant current source 110 of evaluation and control unit 100 is connected to terminal APE and current measuring device 120 of evaluation and control unit 100 is connected to terminal IPE (method step S3).

Value Ip measured with the aid of current measuring device 120 is compared with value Iq specified for constant current source 110, for example with the aid of a software of evaluation and control unit 100 (method step S4). In the present example, value Iq represents a value that is stored in a device 131 for determining a setpoint value.

In the present example, values Ip, Iq are congruent. It is thus deduced overall that neither a short circuit nor a shunt is present at the line of broadband lambda sensor 200 connected to terminal IPE (method step S5).

In contrast, the method would have come to the conclusion that a short circuit or a shunt is present if either potential Up had been outside of the predefined limits or value Ip measured with the aid of current measuring device 120 had differed from value Iq specified for constant current source 110 by more than a threshold value. In this case, the corresponding error would have been entered into an error memory of the evaluation and control unit, for example, or in the error memory of a control device connected to the evaluation and control unit (method step S6).

Figure 3:
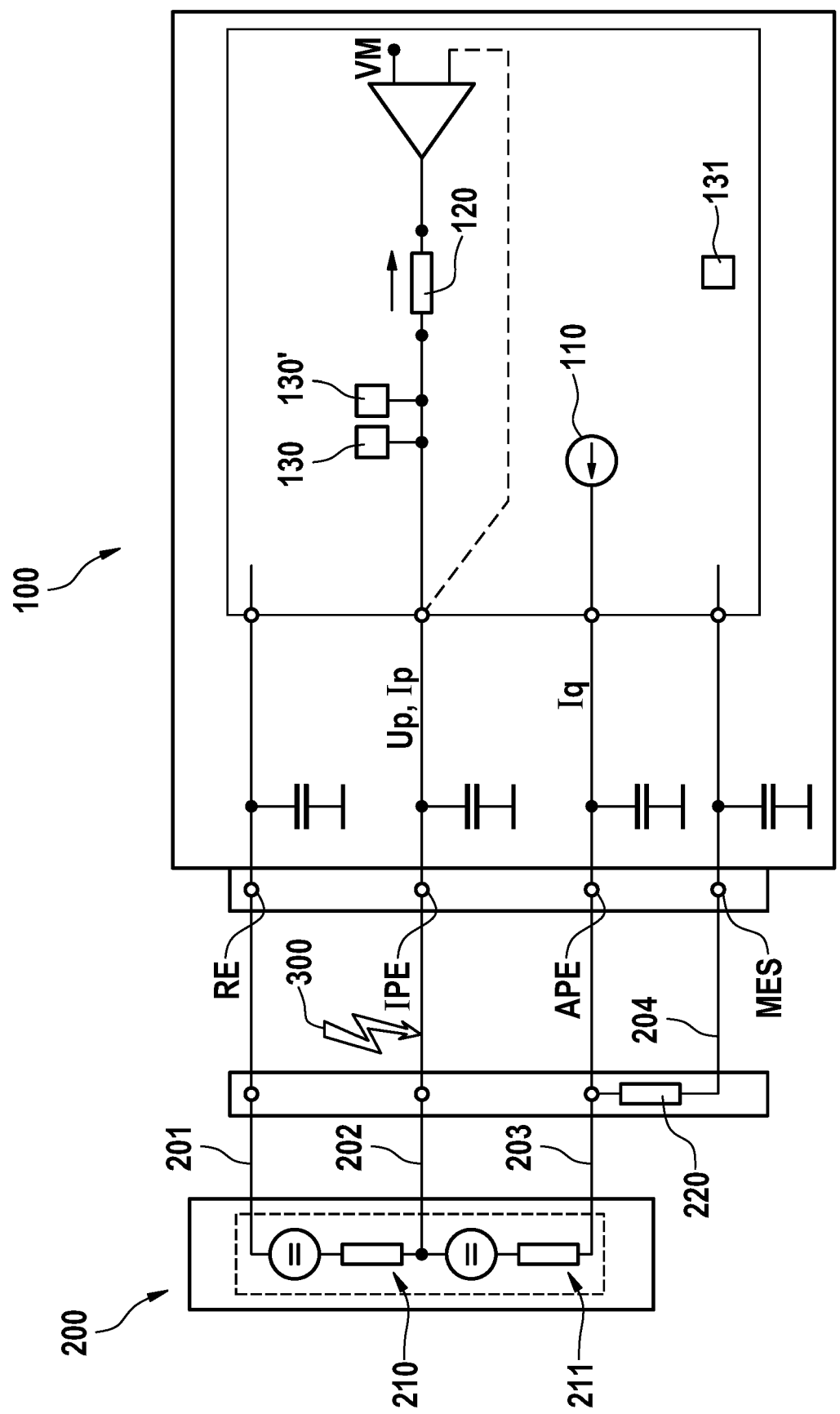
FIG. 3 elucidates the system from FIG. 1 in the error case.

FIG. 3 elucidates the system from FIG. 1 in the error case, in which a short circuit 300 occurs between line 202 of the broadband lambda sensor and a battery voltage, for example. In this case, an additional current flows to current measuring device 120. Value Ip measured with the aid of current measuring device 120 then differs from value Iq specified for constant current source 110 by more than a threshold value, although potential Up is still within predefined limits L1, L2 in the present example.

One alternative of the example provides that for comparison purposes with value Ip value Iq is not used, which is specified for constant current source 110, but that in a separate method step, constant current source 110 is connected to current measuring device 120 within the evaluation and control unit, so that actual value Iq' of constant current source 110 is measured by current measuring device 120. This measured actual value Iq' is subsequently used for comparison purposes with value Ip instead of specified value Iq, as described above.

What is claimed is:

1. An evaluation and control unit, in the form of an ASIC, for operating a broadband lambda sensor that includes at least one electrical line, the evaluation and control unit including at least one electrical terminal for electrically connecting to the electrical line of the broadband lambda sensor, the evaluation and control unit including a device configured to determine a setpoint value of a current flowing into the electrical terminal and to compare the determined setpoint value with a current actually flowing into the electrical terminal, and to compare, using comparators, an electrical potential being applied to the electrical terminal with predefined limits.

2. A method for diagnosing at least one electrical line of a broadband lambda sensor, the electrical line of the broadband lambda sensor being connected to a terminal of an evaluation and control unit, the evaluation and control unit being in the form of an ASIC and being configured to operate the broadband lambda sensor, the evaluation and control unit including a device configured to determine a setpoint value of a current flowing into the electrical terminal and to compare the determined setpoint value with a current actually flowing into the electrical terminal, and to compare, using comparators, an electrical potential being applied to the electrical terminal with predefined limits, the method comprising:
ruling out a presence of a short circuit or shunt of the electrical line exactly in the case when neither the electrical potential being applied to the terminal is outside of the predefined limits as determined by the device of the evaluation and control unit nor the electric current flowing into the terminal differs from the setpoint value as determined by the device by more than a threshold value; and/or
deducing a short circuit or shunt of the electrical line is deduced exactly in the case when at least one of the following conditions is met:
the electrical potential being applied to the terminal is outside of the predefined limits,
the electric current actually flowing into the terminal differs from the setpoint value by more than a threshold value.

3. The method as recited in claim 2, wherein when the electric current actually flowing into the terminal differs from the setpoint value by more than the threshold value:
a short circuit or shunt to ground is deduced when the electric current is lower than the setpoint value, and/or
a short circuit or shunt to a supply potential is deduced when the electric current is greater than the setpoint value.

4. The method as recited in claim 2, wherein when the electrical potential being applied to the terminal is outside of the predefined limits:
a short circuit or shunt to ground is deduced when the electrical potential is below the predefined limits, and/or
a short circuit or shunt to a supply potential or to a battery voltage is deduced when the electrical potential is above the predefined limits.

5. The method as recited in claim 2, wherein the setpoint value is defined by a current value that is specified for a constant current source of the control and evaluation unit connected to the terminal.

6. The method as recited in claim 2, wherein the threshold value is defined by an expected measuring accuracy.

7. The method as recited in claim 2, wherein the broadband lambda sensor includes several electrical lines and the evaluation and control unit includes several terminals, respectively one line being connected to a terminal and the diagnosing being carried out cyclically for all lines.

* * * * *